(12) United States Patent
Guo et al.

(10) Patent No.: US 10,629,451 B1
(45) Date of Patent: Apr. 21, 2020

(54) METHOD TO IMPROVE PROFILE CONTROL DURING SELECTIVE ETCHING OF SILICON NITRIDE SPACERS

(71) Applicant: American Air Liquide, Inc., Fremont, CA (US)

(72) Inventors: Xiangyu Guo, Bear, DE (US); James Royer, Newark, DE (US); Venkateswara R. Pallem, Hockessin, DE (US); Nathan Stafford, Damascus, OR (US)

(73) Assignee: American Air Liquide, Inc., Fremont, CA (US)

( * ) Notice: Subject to any disclaimer, the term of this patent is extended or adjusted under 35 U.S.C. 154(b) by 0 days.

(21) Appl. No.: 16/265,782

(22) Filed: Feb. 1, 2019

(51) Int. Cl.
*H01L 21/311* (2006.01)
*H01L 29/66* (2006.01)
*H01L 21/3105* (2006.01)

(52) U.S. Cl.
CPC .. *H01L 21/31116* (2013.01); *H01L 21/31058* (2013.01); *H01L 29/6653* (2013.01)

(58) Field of Classification Search
CPC ............ C23F 1/12; H01L 21/67069; H01L 21/32136; H01L 21/32135; H01L 21/30621; H01L 21/02046; H01L 21/31058; H01L 21/31116; H01L 21/31138; H01L 21/31144; H01L 29/6653
See application file for complete search history.

(56) References Cited

U.S. PATENT DOCUMENTS

| | | | |
|---|---|---|---|
| 9,318,343 B2 | 4/2016 | Ranjan et al. | |
| 2001/0005634 A1 | 6/2001 | Kajiwara | |
| 2011/0068086 A1 | 3/2011 | Suzuki et al. | |
| 2012/0077347 A1 | 3/2012 | Metz et al. | |
| 2013/0105916 A1 | 5/2013 | Chang et al. | |
| 2013/0105996 A1 | 5/2013 | Brink et al. | |
| 2014/0273292 A1 | 9/2014 | Posseme et al. | |
| 2015/0187660 A1* | 7/2015 | Patzer | H01L 21/823864 438/217 |
| 2015/0270140 A1 | 9/2015 | Gupta et al. | |
| 2016/0233335 A1* | 8/2016 | Dasaka | H01L 29/7848 |
| 2016/0293438 A1 | 10/2016 | Zhou et al. | |
| 2018/0102253 A1* | 4/2018 | Basavalingappa | H01L 21/02164 |

FOREIGN PATENT DOCUMENTS

WO  WO 2018 044713  3/2018

* cited by examiner

*Primary Examiner* — Thanh T Nguyen
(74) *Attorney, Agent, or Firm* — Yan Jiang

(57) ABSTRACT

Cyclic etch methods comprise the steps of: i) exposing a SiN layer covering a structure on a substrate in a reaction chamber to a plasma of hydrofluorocarbon (HFC) to form a polymer layer deposited on the SiN layer that modifies the surface of the SiN layer, the HFC having a formula $C_xH_yF_z$ where x=2-5, y>z, the HFC being a saturated or unsaturated, linear or cyclic HFC; ii) exposing the polymer layer deposited on the SiN layer to a plasma of an inert gas, the plasma of the inert gas removing the polymer layer deposited on the SiN layer and the modified surface of the SiN layer on an etch front; and iii) repeating the steps of i) and ii) until the SiN layer on the etch front is selectively removed, thereby forming a substantially vertically straight SiN spacer comprising the SiN layer on the sidewall of the structure.

20 Claims, 10 Drawing Sheets

METHOD TO IMPROVE PROFILE CONTROL DURING SELECTIVE ETCHING OF SILICON NITRIDE SPACERS

TECHNICAL FIELD

Disclosed are cyclic atomic layer etch (ALE) methods for spacer patterning in semiconductor applications. In particular, the disclosed are cyclic ALE processes for forming vertically straight silicon nitride (SiN) spacers using hydrofluorocarbon (HFC) gases. The disclosed HFC gases have a formula $C_xH_yF_z$, where x=2-5, y>z, being saturated or unsaturated, linear or cyclic, to selectively plasma etch SiN.

BACKGROUND

Continuous downscaling of semiconductor devices brings more and more challenges to semiconductor fabrication processes. For technology node below 14 nm, one of the most critical steps is a spacer etching. It requires a perfect anisotropy etching (no critical dimension (CD) loss) without damaging nor consumption of an exposed material like silicon, and silicon oxide. It is usually done by plasma etching using a fluorocarbon-based chemistry. However, with increased aspect ratios associated with advanced technology nodes, conventional etching processes no longer allow etch specifications, such as profile control (e.g., footing and surface roughness), damage-free to an underlying layer, CD control, etc., to be reached.

In industry, the standard etch process used for SiN etching is a HFC combined with oxidizer and/or noble gas, for example, $CH_3F$ combined with an oxidizer (e.g. $O_2$), a noble gas (e.g. Ar or He), and occasionally an additional F or H containing gas (e.g. $CH_4$, or $CF_4$). However, it is difficult to manage tradeoffs between etch selectivity, profile control and damages to the underlying layer. Previous patents about SiN etch claimed using different HFCs to selectively etch SiN spacer but no quantifiable information regarding the profile control.

US20130105916A1 to Chang et al. discloses a high selectivity nitride etch process, which includes an anisotropic etching of SiN using HFC plasma to form HFC polymers on $SiN_x$, $SiO_2$, and Si of varying thicknesses. The process is a selective etching of SiN using a HFC having a formula $C_xH_yF_z$ where x=3-6, y>z, saturated or unsaturated, linear or cyclic. But Chang et al. do not disclose any discussion about profile control, such as footing control. The etch process Chang et al. disclose is not a cyclic process.

US20110068086A1 to Suzuki et al. disclose a plasma etching method on planar wafers including plasma etching a target using $C_xH_yF_z$, x=3-5, y>z, saturated molecules only, linear or cyclic HFC. More specifically, Suzuki et al. discloses selectively etching of $SiN_x$ to $SiO_2$ by utilizing the specific HFC under the plasma conditions on planar wafers rather than a patterned wafer containing semiconductor structures. As illustrated in the Example, Suzuki et al. used 2,2-Difluoro-n-butane to etch SiN planar wafer and SiO planar wafer.

U.S. Pat. No. 8,501,630 or US 20120077347A1 to Metz et al. discloses a plasma etching method for selectively etching a substrate. The plasma etching process uses a process composition having a process gas containing C, H and F, and a non-oxygen-containing additive gas. The process gas includes $CH_3F$, $CHF_3$, $CH_2F_2$, or any combination of two or more thereof. The plasma etching process that Metz et al. disclosed is not a cyclic process.

US 20010005634 A1 to Kajiwara discloses a dry etching method for forming a contact hole by high selective etching SiN over $SiO_2$ using $CH_2F_2$ as an etching gas.

US20130105996 to Brink et al. discloses a low energy etch process for nitrogen-containing dielectric layer included in a stack that includes from bottom to top a nitrogen-containing dielectric layer, an interconnect level dielectric material layer, and a hard mask layer formed on a substrate. The nitrogen-containing dielectric layer were plasma etched using HFC having $C_xH_yF_z$, x=3-6, y>z. Brink et al. keep salient on selectivity to Si or $SiO_2$.

US 20140273292A1 to Posseme et al. discloses methods of forming SiN spacers including the steps of depositing a SiN layer atop an exposed silicon containing layer and an at least partially formed gate stack disposed atop a substrate; modifying a portion of the SiN layer by exposing the SiN layer to a hydrogen or helium containing plasma that is substantially free of fluorine; and removing the modified portion of the SiN layer by performing a wet cleaning process to form the SiN spacers. In one embodiment, Posseme et al. discloses the SiN layer was etched using a HFC-containing gas such as $CH_2F_2$, $CH_4$, $CHF_3$.

US 20150270140A1 to Gupta et al. discloses atomic layer or cyclic plasma etching chemistries and processes to etch films including Si, Ti, Ta, W, Al, Pd, Ir, Co, Fe, B, Cu, Ni, Pt, Ru, Mn, Mg, Cr, Au, alloys thereof, oxides thereof, nitrides thereof, and combinations thereof. Examples include Fe and Pd etch using $Cl_2$ and ethanol (EtOH), Ni, Co, Pd, or Fe etch using $Cl_2$ and acetylacetonate (Acac).

US20160293438A1 to Zhou et al. discloses a cyclic spacer etching process with improved profile control, but the method is based on $NF_3/NH_3$ plasma, rather than HFC gases.

WO2018/044713 A1 to Sherpa et al. discloses a method of quasi-atomic layer etching of SiN including the first step of process gas containing H and optionally a noble gas; $H_2$, or $H_2$ and Ar; the second step: process gas containing N, F, O, and optionally a noble element $NF_3$, $O_2$, and Ar.

U.S. Pat. No. 9,318,343B2 to Ranjan et al. discloses a method to improve etch selectivity during SiN spacer etch that includes a cyclical process of etching and oxidation of a SiN spacer and silicon (such as polycrystalline silicon) using a process gas containing a HFC gas expressed as $C_xH_yF_z$, wherein x, y, and z are non-zero. The HFC disclosed in Renjan et al, is $CH_3F$. Ranjan et al. are silent about the profile of the spacers, such as footing and surface roughness of the spacers.

Discovery of new and novel etching components that are applicable to improving profile control for etching silicon-containing spacers, such as SiN spacer, is challenging, since their applications to etching the silicon-containing spacers have to meet the requirements of the etching profile, such as less to no footing, less to no fluoride formation, a smooth spacer surface after etching, etc. Thus, there are needs to provide such etching components to meet these requirements.

SUMMARY

There is disclosed a cyclic etch method comprising the steps of: i) exposing a SiN layer covering structures on a substrate in a reaction chamber to a plasma of hydrofluorocarbon (HFC) to form a polymer layer deposited on the SiN layer that modifies the surface of the SiN layer, the HFC having a formula $C_xH_yF_z$ where x=2-5, y>z, the HFC being a saturated or unsaturated, linear or cyclic HFC, ii) exposing the polymer layer deposited on the SiN layer to a plasma of an inert gas, the plasma of the inert gas removing the polymer layer deposited on the SiN layer and the modified surface of the SiN layer on etch front and iii) repeating the steps of i) and ii) until the SiN layer covered on the etch front is removed thereby forming vertically straight SiN spacers with the SiN layer covered on the sidewalls of the structures.

There is also disclosed a cyclic etch method for forming vertically straight SiN spacers, the method comprising the steps of: i) exposing a SiN layer covering structures on a substrate in a reaction chamber to a plasma of hydrofluorocarbon (HFC) to form a polymer layer deposited on the SiN layer that modifies the surface of the SiN layer, the HFC having a formula $C_xH_yF_z$ where x=2-5, y>z, the HFC being a saturated or unsaturated, linear or cyclic HFC, ii) exposing the polymer layer deposited on the SiN layer to a plasma of an inert gas, the plasma of the inert gas removing the polymer layer deposited on the SiN layer and the modified surface of the SiN layer on etch front and iii) repeating the steps of i) and ii) until the SiN layer covered on the etch front is removed thereby forming the vertically straight SiN spacers with the SiN layer covered on the sidewalls of the structures.

There is also disclosed a cyclic etch method for forming vertically straight SiN gate spacers, the method comprising the steps of: i) exposing a SiN layer covering gate stacks on a substrate in a reaction chamber to a plasma of hydrofluorocarbon (HFC) selected from the group consisting of $C_2H_5F$ and $C_3H_7F$ to form a polymer layer deposited on the SiN layer that modifies the surface of the SiN layer, ii) exposing the polymer layer deposited on the SiN layer to a plasma of an inert gas, the plasma of the inert gas removing the polymer layer deposited on the SiN layer and the modified surface of the SiN layer on etch front and iii) repeating the steps of i) and ii) until the SiN layer covered on the etch front is removed thereby forming the vertically straight SiN gate spacers with the SiN layer covered on the sidewalls of the gate stacks.

Either of the disclosed methods may include one or more of the following aspects:
- further comprising the steps of, after the step of i),
  - pumping the reaction chamber to a vacuum;
  - purging the reaction chamber with $N_2$;
  - pumping the reaction chamber to the vacuum; and
  - introducing the inert gas into the reaction chamber to generate the plasma of the inert gas;
- further comprising the steps of, after the step of ii),
  - pumping the reaction chamber to a vacuum;
  - purging the reaction chamber with $N_2$;
  - pumping the reaction chamber to the vacuum; and
  - introducing the HFC into the reaction chamber to generate the plasma of the HFC;
- exposing the SiN layer to a plasma of a gas mixture of the HFC and the inert gas;
- at least a majority of the SiN layer on the sidewall of the gate stack being not removed;
- less than 10% of the thickness of the SiN layer on the sidewall of the gate stack being removed;
- less than 5% of the thickness of the SiN layer on the sidewall of the gate stack being removed;
- less than 1% of the thickness of the SiN layer on the sidewall of the gate stack being removed;
- no measurable reduction in the thickness of the SiN layer on the sidewall of the gate stack being produced;
- the inert gas being selected from $N_2$, Ar, Kr or Xe;
- the inert gas being Ar;
- the HFC being $C_2H_5F$;
- the HFC being $C_3H_7F$;
- the substrate comprising a silicon-containing material;
- the substrate being silicon;
- the structure being a gate stack;
- the HFC plasma interacting with SiN to form a C rich polymer (C:F>1);
- the C rich polymer being a polymer layer deposited on top of the SiN layer;
- the HFC selectively etching the SiN layer over the structures;
- the HFC selectively etching the SiN layer over the substrate;
- an infinite selectivity of SiN versus the structures;
- an infinite selectivity of SiN versus the gate stacks;
- an infinite selectivity of SiN to p-Si, SiO, SiON and SiCN;
- an ALE over etch recipe being applied;
- the ALE over etch recipe ranging from approximately 10% ALE over etch to approximately 200% ALE over etch;
- the ALE over etch recipe ranging from approximately 50% ALE over etch to approximately 200% ALE over etch;
- introducing the HFC gas into the reaction chamber at a flow rate ranging from approximately 1 sccm to approximately 10 slm;
- introducing the HFC gas into the reaction chamber at a flow rate ranging from approximately 1 sccm to approximately 100 sccm;
- introducing the inert gas into the reaction chamber at a flow rate ranging from approximately 1 sccm to approximately 10 slm;
- introducing the inert gas into the reaction chamber at a flow rate ranging from approximately 10 sccm to approximately 200 sccm;
- the reaction chamber having a pressure ranging from approximately 1 mTorr to approximately 50 Torr;
- the reaction chamber having a pressure ranging from approximately 1 mTorr to approximately 10 Torr;
- the reaction chamber having a pressure ranging from approximately 300 mTorr to approximately 1 Torr;
- the substrate temperature in the chamber ranging from approximately $-110°$ C. to approximately $2000°$ C.;
- the substrate temperature in the chamber ranging from approximately $-20°$ C. to approximately $1000°$ C.;
- the substrate temperature in the chamber ranging from approximately $25°$ C. to approximately $700°$ C.;
- the substrate temperature in the chamber ranging from approximately $25°$ C. to approximately $500°$ C.;
- the substrate temperature in the chamber ranging from approximately $25°$ C. to approximately $50°$ C.;
- the reaction chamber wall temperatures ranging from approximately $25°$ C. to approximately $100°$ C.;
- the plasma process time varying from 0.01 s to 10000 s;
- the plasma process time varying from 1 s to 30 s;
- $N_2$ purge time varying from 1 s to 10000 s;
- $N_2$ purge time varying from 10 s to 60 s;
- less to no footing formed at each corner between the SiN spacer and the substrate;
- lees to no excess material left proximate the SiN layer and the substrate;
- no fluoride residuals left on the vertically straight SiN spacers and the etch front;
- surface roughness on the surface of the vertically straight SiN spacers and the surface of the etch front after the cyclic etch being improved comparing to those before the cyclic etch;
- removing the polymer layer being an ion bombardment process;

further comprising the step of adding an oxygen-containing gas; and the oxygen-containing gas being selected from the group consisting of $O_2$, $O_3$, CO, $CO_2$, NO, $NO_2$, $N_2O$, $SO_2$, COS, $H_2O$ and combination thereof.

There are also disclosed HFC etching gases having a formula $C_xH_yF_z$ where x=2-5, y>z. The disclosed HFC etching gases include one or more of the following aspects:

the HFC being a saturated or unsaturated, linear or cyclic HFC;

having a purity being greater than approximately 99% by volume;

having a purity being greater than approximately 99.9% by volume;

containing less than 1% by volume trace gas impurities;

the trace gas impurities comprising water;

the trace gas impurities comprising $CO_2$;

the trace gas impurities comprising $N_2$; and the HFC etching gas having a water content of less than 20 ppmw.

NOTATION AND NOMENCLATURE

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "wafer" or "patterned wafer" refers to a wafer having a stack of silicon-containing films on a substrate and a patterned hardmask layer on the stack of silicon-containing films formed for pattern etch.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "pattern etch" or "patterned etch" refers to etching a non-planar structure, such as a stack of silicon-containing films below a patterned hardmask layer.

As used herein, the term "etch" or "etching" refers to an isotropic etching process and/or an anisotropic etching process. The isotropic etch process involves a chemical reaction between the etching compound and the substrate resulting in part of material on the substrate being removed. This type of etching process includes chemical dry etching, vapor phase chemical etching, thermal dry etching, or the like. The isotropic etch process produces a lateral or horizontal etch profile in a substrate. The isotropic etch process produces recesses or horizontal recesses on a sidewall of a pre-formed aperture in a substrate. The anisotropic etching process removes material only perpendicular to the surface of a substrate, which performs accurate transfer of a mask pattern. The dry etching process may be a plasma etching process. A plasma is any gas in which a significant percentage of the atoms or molecules are ionized. The plasma may be a capacitively coupled plasma (CCP) generated by a CCP system that essentially consists of two metal electrodes separated by a small distance, placed in a reactor. A typical CCP system is driven by a single radio-frequency (RF) power supply. One of two electrodes is connected to the power supply, and the other one is grounded. When an electric field is generated between electrodes, atoms are ionized and release electrons. The electrons in the gas are accelerated by the RF field and can ionize the gas directly or indirectly by collisions, producing secondary electrons. The plasma may also be an inductively coupled plasma (ICP) or transformer coupled plasma (TCP) generated by an ICP system in which the energy is supplied by electric currents which are produced by electromagnetic induction, that is, by time-varying magnetic fields. The ICP discharges are of relatively high electron density, on the order of $10^{15}$ cm$^{-3}$. As a result, the ICP discharges have wide applications where a high-density plasma (HDP) is needed. Another benefit of ICP discharges is that they are relatively free of contamination, because the electrodes are completely outside the reaction chamber. The plasma etching process produces a vertical etch profile in a substrate. The plasma etching process produces vertical apertures, trenches, channel holes, gate trenches, staircase contacts, capacitor holes, contact holes, etc., in the substrate.

The term "100% etch" means an ALE process etches a material thoroughly through its thickness. The term "over etch" means continuing the ALE process even after the material is etched through. For example, in the disclosed method, if one ALE recipe has etch rate of 1 nm/cycle for SiN layer and the SiN layer has a thickness of 10 nm, then 10 cycles is needed to completely etch through 10 nm thick SiN. This means 100% etch. If one sets the etch cycles more than 10 cycles to etch the SiN layer, the ALE is an "over etch". For example, if one sets 15 etch cycles to etch the SiN layer, the etching process is a 50% over etch. If one sets 20 etch cycles to etch the SiN layer, the etching process is 100% over etch.

The term of "deposit" or "deposition" refers to a series of processes where materials at atomic or molecular levels are deposited on a wafer surface or on a substrate from a gas state (vapor) to a solid state as a thin layer. Chemical reactions are involved in the process, which occur after creation of a plasma of the reacting gases. The plasma may be a CCP, as described above, generally created by radio frequency (RF) (alternating current (AC)) frequency or direct current (DC) discharge between two electrodes, the space between which is filled with the reacting gases, The deposition methods may include atomic layer deposition (ALD) and chemical vapor deposition (CVD).

The term "mask" refers to a layer that resists etching. The hardmask layer may be located above the layer to be etched.

The term "aspect ratio" refers to a ratio of the height of a trench (or aperture) to the width of the trench (or the diameter of the aperture).

The term "selectivity" means the ratio of the etch rate of one material to the etch rate of another material. The term "selective etch" or "selectively etch" means to etch one material more than another material, or in other words to have a greater or less than 1:1 etch selectivity between two materials.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "etching compound" and "etching gas" may be used interchangeably when the etching compound is in a gaseous state under room temperature and ambient pressure. It is understood that an etching compound may correspond to, or related to an etching gas, and that the etching gas may refer to the etching compound.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Please note that the silicon-containing films, such as SiN and SiO, are listed throughout the specification and claims without reference to their proper stoichiometry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Herein, SiN in the following description may be used to represent $Si_kN_l$ containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As and/or Ge.

Ranges may be expressed herein as from about one particular value, and/or to about another particular value. When such a range is expressed, it is to be understood that another embodiment is from the one particular value and/or to the other particular value, along with all combinations within said range.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Disclosed are methods to improve profile control for forming silicon nitrile (SiN) spacers on Si-containing substrates with high selectivity in semiconductor applications. The disclosed methods apply a cyclic atomic layer etching (ALE) process using a plasma of a HFC and a plasma of a noble gas to selectively etch a SiN layer over structures covered by the SiN layer and/or a underlying Si-containing layer (e.g., a substrate). Here, the structures may be a gate or a gate stack.

The disclosed methods have significant improved profile controls for forming the SiN spacers. Critical characteristics of the formed SiN spacers include high selectivity of SiN to the underlying Si-containing layer, such as, poly-Si (or Si), and $SiO_2$. The critical characteristics of the formed SiN spacers also include no chemical damage to the underlying Si-containing layer even when using an over-etch recipe, less to no excess material proximate the SiN layer and the substrate, less to no footing at the bottom edge of the spacers, no F residuals left on the sidewall of the spacers, etc.

In semiconductor applications, a spacer is a layer of a material deposited on a structure, such as a gate or a gate stack, by CVD or ALD to isolate gate contact and source and drain contacts in metal-oxide-semiconductor field-effect transistors (MOSFETs). The material may be SiN or the like. The spacer passivates sidewalls of the gate stack. The disclosed methods may apply to any types of spacers in semiconductor applications, including gate spacers, patterning spacers having self-aligned double patterning (SADP) spacers, self-aligned quadruple patterning (SAQP) spacers, etc. Here the gate stack may be a digital switch, random-access memory (RAM), amplifier, field-effect transistor-based biosensor (BioFET), DNA field-effect transistor (DNAFET), ferroelectric, magnetic, electrolytic, etc. More specifically, the gate stack may be high-k gate stacks including flash memory, such as 3D NAND and NOR, silicon-oxide-nitride-oxide-silicon (SONOS), strained interfaces including global strain and local strain, ferroelectric gate stacks, electrolytic interfaces, etc.

Figure 1A:
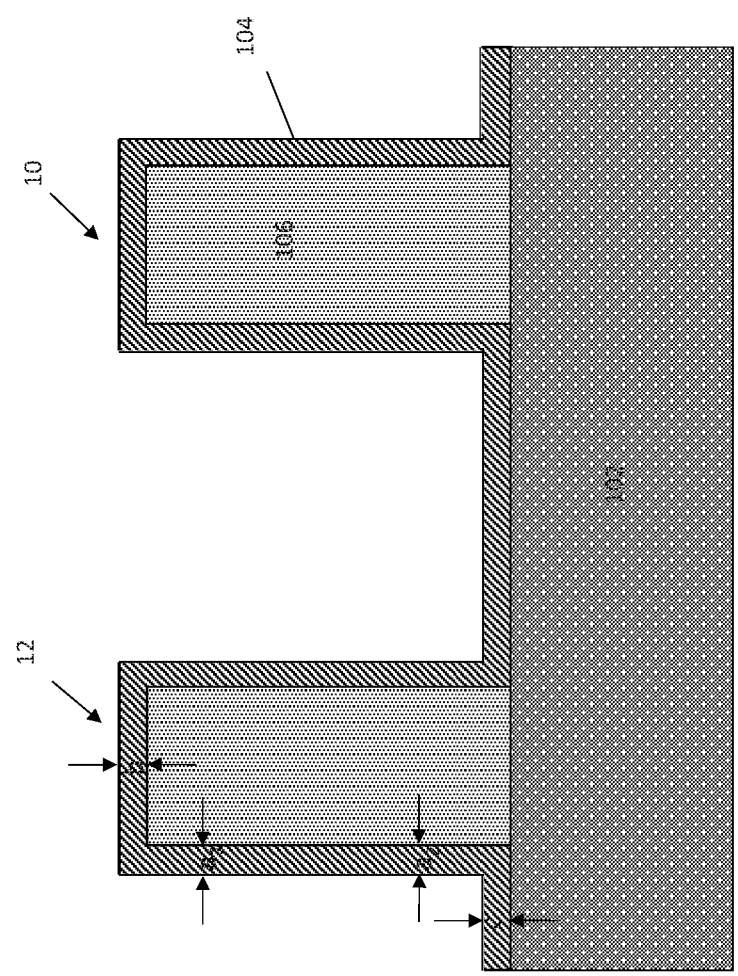
FIG. 1a is a cross-sectional side view of an exemplary pattern formed for producing SiN spacers on an underlying substrate in the art.
Figure 1B:
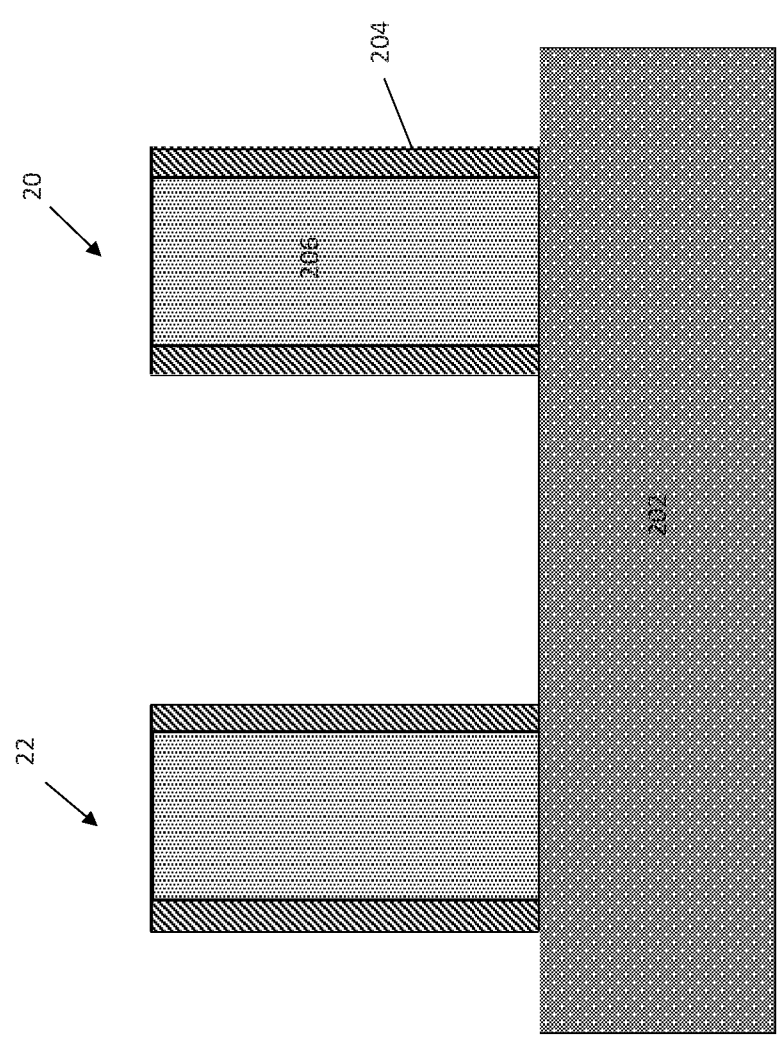
FIG. 1b is a cross-sectional side view of exemplary SiN spacers on an underlying substrate with an ideal etch result of SiN spacers in the art.
Figure 1C:
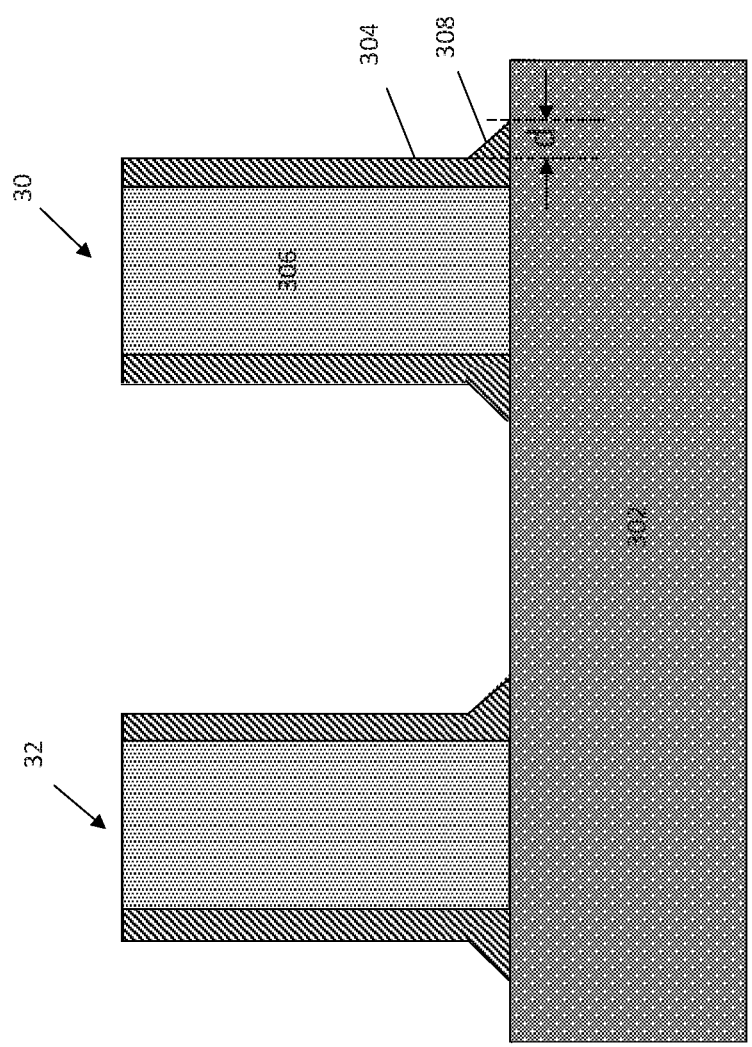
FIG. 1c is a cross-sectional side view of exemplary SiN spacers on an underlying substrate with actual spacer etching processes that produce footing at the bottom of the spacers in the art.

FIG. 1a to FIG. 1c demonstrate exemplary cross-sectional side views of exemplary SiN spacers formation on an underlying substrate. FIG. 1a shows a trench pattern, but is not limited to, formed for producing SiN spacers. SiN covered structures 10 and 12 were formed on the top of a substrate 102. A plurality of SiN covered structures may be formed on the top of the substrate 102, but only two structures 10 and 20 are shown. The substrate 102 may be a FinFET (Fin Field-effect transistor) substrate composed of Si-containing material, such as Si, poly-Si, $SiO_2$, etc. Numeral 104 represents a layer of SiN layer that covers structures 106 on the substrate 102. The structure 106, also called a pillar in the art, may be a gate stack covered by the SiN layer 104. In an ideal situation, the SiN layer that horizontally covers etch front, the top of structures 106 or the top of the pillar and the top of substrate 102 or the bottom of the trench, should be removed and a vertically straight and uniform SiN sidewall on the structures 106 with less to no footing at the bottom corner should be obtained. Here, "$a_1$" and "$a_2$" represent the thickness of SiN layer on sidewalls 104 at different heights of the structure or gate stack. The height of "$a_1$" may be close to the top of the pillar, for example, at the height about ⅓ of the total height of the structure 106 below the top of the pillar; "$a_2$" may be at the height close to the substrate 102 at the height about ⅓ of total height of the structure 106 above the substrate 102. Since the structure 106 under the SiN layer 104 may be curved at the bottom adjacent to the substrate 102 (not shown), the value of "$a_2$" may be less than the value of "$a_1$" with a vertically straight SiN spacer. "b" and "c" represent the thickness of SiN layer on top of the structures 106 and on top of the substrate 102, respectively. Here "b" and "c" are the thicknesses of etch front. Furthermore, "c" may also represent the thickness of the removal of substrate 102 after removing the SiN layer. In this case, "c" may be a negative value. As shown in FIG. 1b, an ideal SiN spacer etch result is presented, in which a vertically straight and uniform SiN sidewall 204 coverage on the structures 206 is formed and the SiN layer on the etch front that horizontally covers the top of structures 206 and the top of substrate 202 are removed. However, actual spacer etching processes often have excess material left proximate the SiN layer and the substrate, producing footing 308 at the bottom of the spacers, as shown in FIG. 1c. Here the horizontal length of the footing 308 adjacent to the substrate 302, "d", is defined to represent the size of the footing.

The disclosed cyclic ALE processes for controlling etch profile of SiN spacers formed on Si-containing substrates overcome the shortages of footing when manufacturing the SiN spacers. The disclosed cyclic ALE processes for controlling etch profile of SiN spacers formed on Si-containing substrates also produce vertically straight spacers without tapering when manufacturing the SiN spacers. The disclosed cyclic ALE processes comprises a surface modification step or a deposition step and a surface removal step or an etching step in one ALE cycle. During the surface modification step, a thin layer of polymer is deposited on the surface of the SiN layer that modifies the surface of the SiN layer (see FIG. 1a, SiN layer 104) in a reaction chamber. The thin layer of polymer is formed by a plasma of a HFC gas or a plasma of a gas mixture of a HFC gas and an inert gas, such as $N_2$, Ar, Kr, Xe, preferably Ar. The HFC gas reacts with the material SiN on the surface of the SiN layer, forming the thin layer of polymer which is a C rich polymer (C:F>1) and also called a modified surface layer on the surface of the SiN layer where chemical bonds are formed at an interlayer between the thin layer of polymer and the surface of the SiN layer. At the surface removal step, the modified surface layer is etched or removed by a pure inert gas (e.g., Ar) plasma through energetic ion bombardment to sputter the modified surface layer, which are highly volatile and may be pumped out from the chamber. After the surface removal step, the surface modification step is repeated, forming a cyclic ALE process. With the cyclic ALE, an ALE over etch recipe may be applied to further remove the SiN layer on the etch front with an infinite selectivity of SiN versus the structures or the gate stacks. The ALE over etch recipe may range from approximately 10% ALE over etch to approximately 200% ALE over etch, preferably, from approximately 50% ALE over etch to approximately 200% ALE over etch. These processes may be cyclized and enable step-by-step removal of materials, which increases pattern fidelity and minimizes a footing of SiN spacer. Between the surface modification step and the surface removal step or after the deposition step and the etching step, a $N_2$ purge step is applied. The $N_2$ purge step includes a vacuum pump step to pump the HFC gas out of the reaction chamber before the $N_2$ purge step and a vacuum pump step to pump $N_2$ out of the reaction chamber after $N_2$ purge step.

An ideal cyclic ALE process is based on self-limiting reactions, which means the reactants only react with the available surface sites on the substrate while keep the bottom layer intact. ALE process conditions may be optimized by tracking the self-limiting nature regarding the reactant flow rates and exposure time. A constant purge of $N_2$ was used at the end of each step to eliminate the excessive etchant from the system to avoid any synergistic reactions.

Figure 2:
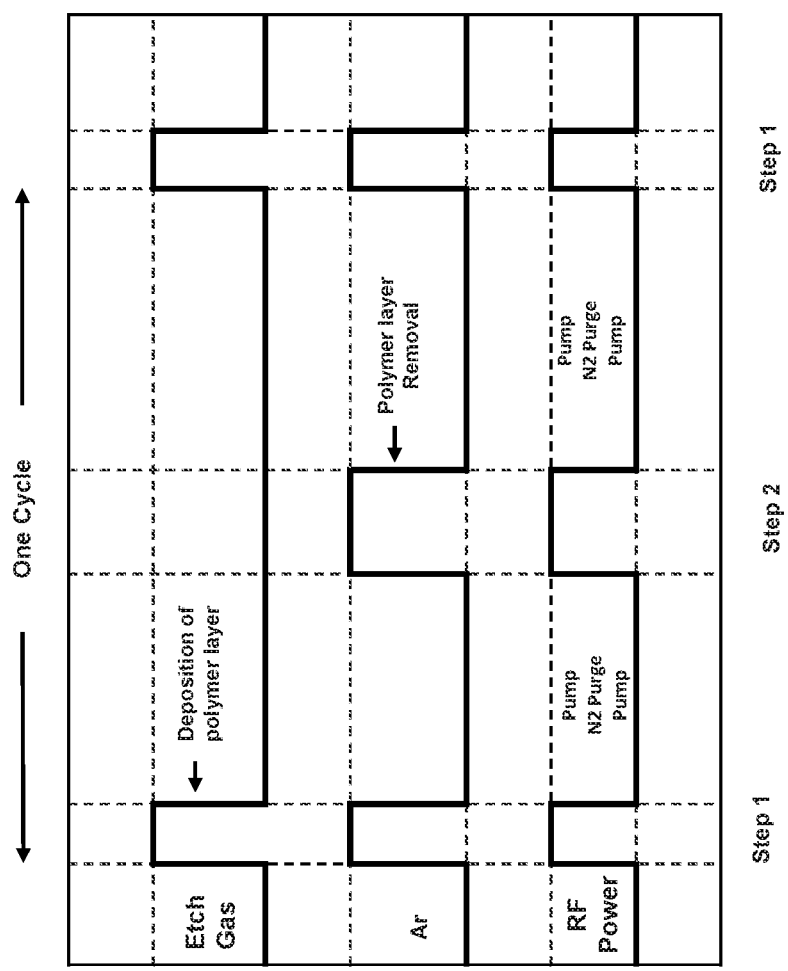
FIG. 2 is a process flow per cycle of the disclosed cyclic ALE process.

Referring to FIG. 2, in one cycle of the disclosed ALE process, a plasma etching gas formed from a gas mixture of a HFC gas and Ar deposits a thin layer of polymer on the surface of the SiN layer in a reaction chamber in Step 1. The thin layer of polymer is then etched or removed by a pure inert gas (e.g., Ar) plasma in Step 2. After each Step, the reaction chamber experiences a pump/$N_2$ purge/pump process, which includes pumping the reaction chamber to a vacuum, filling $N_2$ into the reaction chamber for purging and pumping the reaction chamber to a vacuum again before proceeding the next Step.

The disclosed cyclic ALE methods may include using the HFC gases, having a formula $C_xH_yF_z$ where x=2-5, y>z, being saturated or unsaturated, linear or cyclic, to selectively plasma etch SiN. The HFC plasma interacts with SiN forming C rich polymer (C:F>1) which deposits on top of the SiN layer forming a polymer layer. The disclosed HFC gases may be used to mix with an inert gas in a plasma chamber to selectively etch the polymer layer and a single atomic layer of the SiN layer as well. Thus, the SiN spacers are formed with improved profile control, such as high selectivity, minimized footing, limited fluorine formation and smooth surface of the SiN spacers. The inert gas may be Ar, Kr and Xe. Preferably, Ar.

The disclosed HFC gases for forming the polymer layer on the SiN layer may include the following HFC gases, i.e., fluoroethane $C_2H_5F$ (CAS #353-36-6) and 1-fluoropropane $C_3H_7F$ (CAS #460-13-9). These HFC gases are used to mix with an inert in a plasma chamber to deposit a polymer layer on the SiN layer. An interlayer between the polymer layer and the SiN layer is formed to modify the surface of the SiN layer. A plasma of an inert gas, such as, Ar, is then selectively removes the polymer layer and the interlayer as well. This is equivalent to remove a single atomic layer of the SiN layer. In this way, the SiN spacers are formed with improved profile control, such as high selectivity, minimized footing, limited fluorine formation and smooth surface of the SiN spacers. The inert gas may be Ar, Kr and Xe, preferably, Ar.

The disclosed HFC gases are provided at greater than 99% v/v purity, preferably at greater than 99.9% v/v purity, by removing key impurities $N_2$, $CO_x$, $SO_x$, $H_2O$, etc.

The disclosed HFC gases contain less than 1% by volume trace gas impurities, with less than 150 ppm by volume of impurity gases, such as $N_2$ and/or $H_2O$ and/or $CO_2$, contained in said trace gaseous impurities. Preferably, the water content in the plasma etching gas is less than 20 ppmw by weight. The purified product may be produced by distillation and/or passing the gas or liquid through a suitable adsorbent, such as a 4 Å molecular sieve.

The disclosed cyclic ALE methods includes providing a plasma processing chamber having a substrate disposed therein. The plasma processing chamber may be any enclosure or chamber within a device in which etching methods take place such as, and without limitation, any chambers or enclosures used for plasma etching, such as, reactive ion etching (RIE), capacitively coupled plasma (CCP) with single or multiple frequency RF sources, inductively coupled plasma (ICP), electron cyclotron resonance (ECR), microwave plasma reactors, remote plasma reactors, pulsed plasma reactors, or other types of etching systems capable of selectively removing a portion of the silicon-containing film or generating active species. Preferred chamber is a CCP chamber.

One of ordinary skill in the art will recognize that the different plasma reaction chamber designs provide different electron temperature control. Suitable commercially available plasma reaction chambers include but are not limited to the Applied Materials magnetically enhanced reactive ion etcher sold under the trademark eMAX™ or the Lam Research Dual CCP reactive ion etcher dielectric etch product family sold under the trademark 2300e Flex™. The RF power in such may be pulsed to control plasma properties and thereby improving the etch performance (selectivity and damage) further.

An oxygen-containing gas may be introduced into the reaction chamber in order to eliminate high polymer deposition or reduce the thickness of the high polymer deposition. The oxygen-containing gas include, without limitation, oxidizers such as, $O_2$, $O_3$, CO, $CO_2$, NO, $NO_2$, $N_2O$, $SO_2$, COS, $H_2O$ and combinations thereof. It is known that addition of oxygen or oxygen containing gases to the plasma chemistry increases F/C ratio of plasma species and reduces polymer formation (See, e.g., U.S. Pat. No. 6,387,287 to Hung et al.). The disclosed HFC gas and the oxygen containing gas may be mixed together prior to introducing into the reaction chamber.

Alternatively, the oxygen-containing gas is introduced continuously into the chamber and the disclosed HFC gas introduced into the chamber in pulses. The oxygen-containing gas comprise between approximately 0.01% by volume to approximately 99.99% by volume of the mixture introduced into the chamber.

In the disclosed cyclic ALE methods, the plasma process time may vary from 0.01 s to 10000 s. Preferably from 1 s to 30 s. $N_2$ purge time may vary from 1 s to 10000 s. Preferably 10 s to 60 s.

The temperature and the pressure within the reaction chamber are held at conditions suitable for the silicon-containing film to react with the activated etching gas. For instance, the pressure in the chamber may be held between approximately 1 mTorr and approximately 50 Torr, preferably between approximately 1 mTorr and approximately 10 Torr, more preferably between approximately 300 mTorr and approximately 1 Torr, as required by the etching parameters. Likewise, the substrate temperature in the chamber may range between approximately −110° C. to approximately 2000° C., preferably between approximately −70° C. to approximately 1500° C., more preferably between approximately −20° C. to approximately 1000° C., even more preferably between approximately 25° C. to approximately 700° C., even more preferably between approximately 25° C. to approximately 500° C., and even more preferably between approximately 25° C. to approximately 50° C. Chamber wall temperatures may range from approximately 25° C. to approximately 100° C. depending on the process requirements.

In one embodiment, the disclosed HFC gas is introduced into the reaction chamber containing the substrate having structures, such as gate stacks, formed thereon with a covered SiN layer. The gas may be introduced to the chamber at a flow rate ranging from approximately 1 sccm to approximately 10 slm. Preferably 1 sccm to 100 sccm. The inert gas may be introduced to the chamber at a flow rate ranging from approximately 1 sccm to approximately 10 slm. Preferably 10 sccm to 200 sccm. One of ordinary skill in the art will recognize that the flow rate may vary from tool to tool.

The disclosed cyclic etch methods further comprise the steps of i) positioning a patterned substrate on a substrate holder in a plasma processing chamber or a reaction chamber, the patterned substrate having a SiN layer covering at least one structure on a substrate, here the structure may be a gate stack; the substrate may contain Si-containing layer(s). ii) introducing a HFC gas or a mixture of a HFC gas and an inert gas into the reaction chamber to generate a plasma therein, once the plasma is generated, the plasma depositing a polymer layer on the SiN layer that modifies the surface of the SiN layer, the HFC gas having a formula $C_xH_yF_z$ where x=2-5, y>z, being a saturated or unsaturated, linear or cyclic HFC, the inert gas being $N_2$, Ar, Kr, Xe, preferably Ar; iii) pumping the HFC gas or the mixture of the HFC gas and the inert gas out of the reaction chamber until the reaction chamber reaches to a high vacuum; iv) purging the reaction chamber with $N_2$; v) pumping the reaction chamber to the high vacuum again; that is, pumping $N_2$ out of the reaction chamber until the reaction chamber reaches to the high vacuum; vi) introducing the inert gas into the reaction chamber to generate a plasma of an inert gas; vii) exposing the polymer layer deposited on the SiN layer to the plasma of the inert gas, the plasma of the inert gas removing the polymer layer deposited on the SiN layer on an etch front and the modified surface of the SiN layer on the etch front through ion bombardment; vii) pumping the reaction chamber to the high vacuum; that is, pumping the inert gas out of the reaction chamber until the reaction chamber reaches to the high vacuum; viii) purging the reaction chamber with $N_2$; ix) pumping the reaction chamber to the high vacuum; and x) repeating the steps of ii) to ix) until the SiN layer on the etch front is selectively removed, thereby forming a substantially vertically straight SiN spacer comprising the SiN layer on the sidewall of the gate stack. Here an over etch recipe may be applied, for example, from 50% over etch to 200% over etch may be applied.

In an ideal case, the ion bombardment process only removes the polymer layer and the modified surface of the SiN layer on the etch front, that is, the SiN layer and the modified surface of the SiN layer on the top of the pillar and the bottom of the trench, and remains the SiN layer on the sidewall not changed. In reality, the thickness of the SiN layer on the sidewall might slightly change, due to small deviations and/or a structure having a curved bottom. The disclosed cyclic etch methods provide that at least a majority of the SiN layer on the sidewall of the gate stack is not removed. Preferably, less than 10% of a thickness of the SiN layer on the sidewall of the gate stack is removed, especially the SiN layer close to the bottom of the structure. More preferably, less than 5% of the thickness of the SiN layer on the sidewall of the gate stack is removed. Even more probably, less than 1% of the thickness of the SiN layer on the sidewall of the gate stack is removed, Even more preferably, no measurable reduction in the thickness of the SiN layer on the sidewall of the gate stack is produced.

Compared with conventional SiN spacer etch processes, the disclosed cyclic ALE process using the disclosed HFC gases herein may reduce the SiN footing at the bottom edge of the spacers by more than 70%, from the examples that follow, while maintaining chemical integrity, without causing significant surface roughness or chemical contamination (e.g., F residue) on underlying materials. More specifically, with a cyclic ALE process using $C_2H_5F$, no fluoride residuals produced on the bottom of the trench and sidewall. Here, no fluoride residuals mean less than approximately 0.05% fluoride residuals left on the bottom of the trench and the sidewall, preferably, less than 0.03%. The disclosed cyclic ALE process using the disclosed HFC gases also produces a smooth surface of SiN spacers.

EXAMPLES

The following non-limiting examples are provided to further illustrate embodiments of the invention. However, the examples are not intended to be all inclusive and are not intended to limit the scope of the inventions described herein.

The following examples were conducted with a CCP plasma chamber with variable conditions for each step. Plasma power, pressure, gas flow rate, reaction time and so on were very well controlled. The pressure range was from 300 mtorr to 1 Torr. The temperature range was from 25 C.° to 50 C.°. The gas flow rates for $CH_3F$ or $C_2H_5F$ or $C_3H_7F$ varied from 1 sccm to 10 sccm. The flow rates for noble gas varied from 10 sccm to 200 sccm. The noble gas used was Ar. The RF plasma power ranged from 50 W to 100 W. Plasma process time or reaction time varied from 1 s to 30 s. $N_2$ purge time varied from 10 s to 60 s. Desired purity of $CH_3F$ or $C_2H_5F$ or $C_3H_7F$ was >99.9% by removing key impurities such as $N_2$, CON, $C_xH_yF_z$, SOX, $H_2O$ etc.

The samples used in the following examples were patterned spacer wafers as shown in FIG. 1a, in which the substrate was a Si substrate.

Ellisometer was J.A.Woollam Co. M-2000. SEM (scanning electron microscope) to image the patterned structure was JOEL JSM-7500 SEM. XPS to characterize the surface was Kratos XPS—Supra Model. AFM (atomic force microscope) to examine the surface was Park NX10 AFM. TEM (transmission electron microscope) to image the patterned structure was done with a FEI Tecnai Osiris FEG/TEM operated at 200 kV in bright-field (BF) TEM mode and high-resolution (HR) TEM mode. EDS (electronic diffusion spectra) were acquired on Bruker Quantax EDS system.

Example 1 $CH_3F$ Cyclic ALE Process

Figure 3:
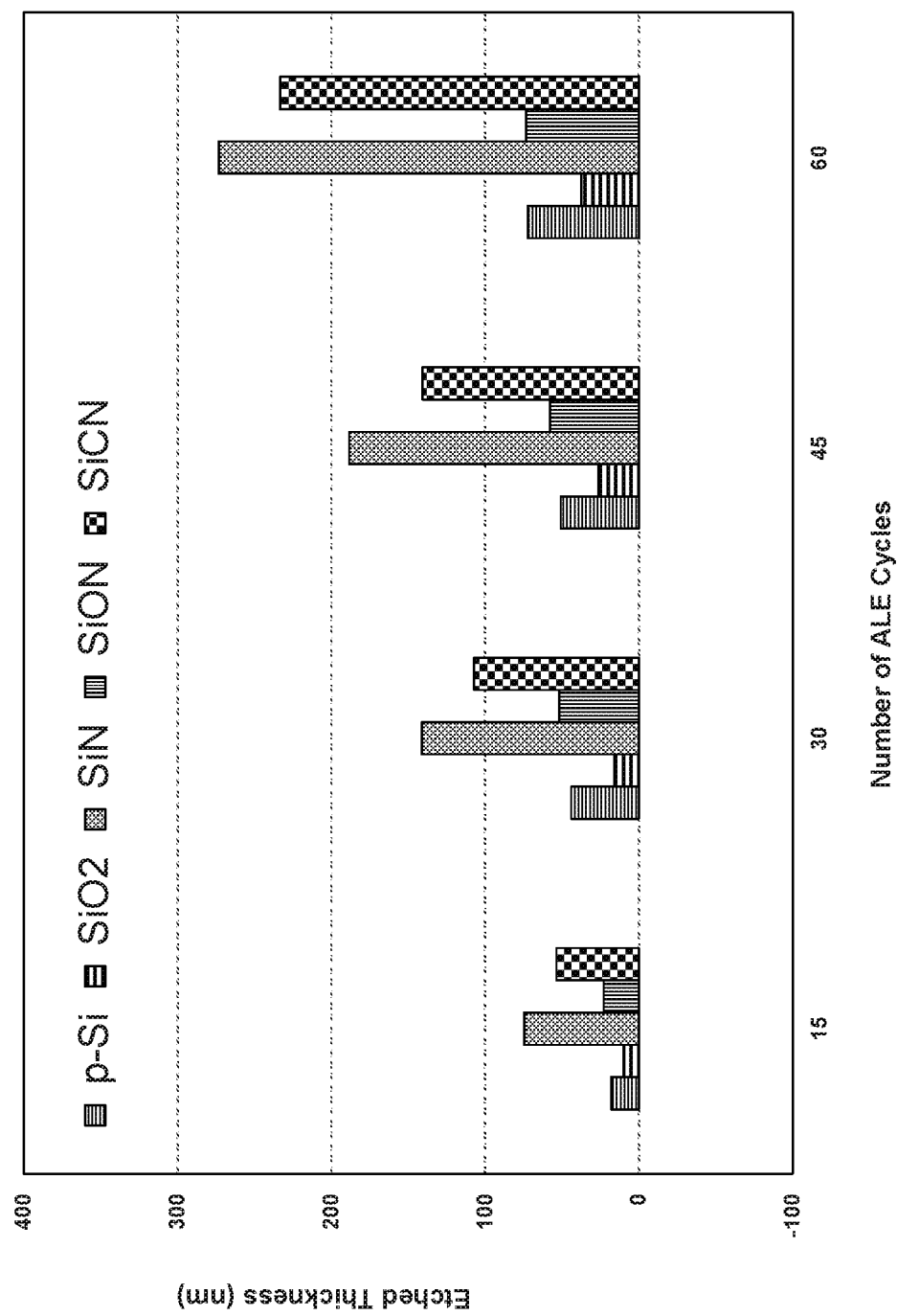
FIG. 3 is a graph of etched thickness versus ALE cycles using $CH_3F$.

The $CH_3F$ cyclic ALE process was conducted under optimized ALE conditions. Referring to FIG. 2, the etching gas was $CH_3F$. The deposition step (Step 1) with $CH_3F$ was performed with RF power 75 W, pressure 300 mTorr, Ar gas flow rate 100 sccm, $CH_3F$ flow rate 5 sccm and reaction time for the deposition step was 4 seconds. The removal step (Step 2) was performed with RF power 50 W, pressure 500 mTorr, Ar gas flow rate 100 sccm, no $CH_3F$ and reaction time 30 seconds. The time for the pump/$N_2$ purge/pump process between Step 1 and Step 2 and vice versa, was 90 seconds. FIG. 3 shows etched thickness versus ALE cycles for $CH_3F$. With the increase of the ALE cycles, SiN etched thickness is getting deeper, the selectivity of SiN to p-Si, SiO and SiON is getting higher, and the selectivity of SiN to SiCN may remain not change. The etched thickness of SiN per cycle using $CH_3F$ with various ALE cycles is listed in Table 1.

TABLE 1

Etched thickness of SiN per cycle with various ALE cycles

| | | ALE cycles | | | |
|---|---|---|---|---|---|
| | | 15 | 30 | 45 | 60 |
| Etched | $CH_3F$ | 4.9 | 4.5 | 4.2 | 4.7 |
| thickness | $C_2H_5F$ | 1.49 | 1.47 | 1.36 | 1.37 |
| per cycle (nm) | $C_3H_7F$ | 2.0 | 2.1 | 2.3 | 2.4 |

Example 2 $C_2H_5F$ Cyclic ALE Process

Figure 4:
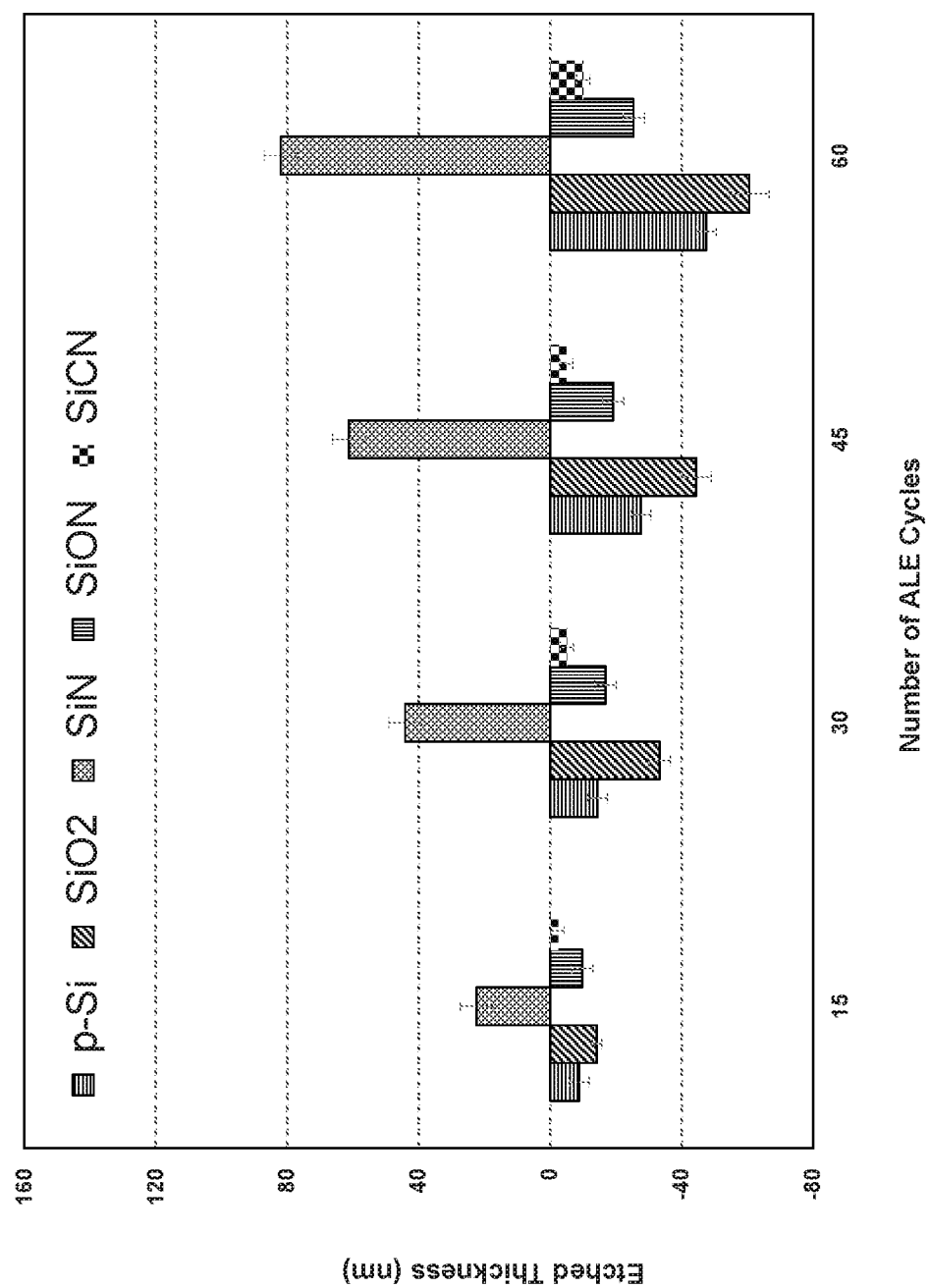
FIG. 4 is a graph of etched thickness versus ALE cycles using $C_2H_5F$.

The $C_2H_5F$ cyclic ALE process was conducted under optimized ALE conditions. Referring to FIG. 2, the etching gas was $C_2H_5F$. The deposition step (Step 1) with $C_2H_5F$ was performed with RF power 75 W, pressure 300 mTorr, Ar gas flow rate 100 sccm, $C_2H_5F$ flow rate 5 sccm and reaction time for the deposition step was 4 seconds. The removal step (Step 2) was performed with RF power 50 W, pressure 500 mTorr, Ar gas flow rate 100 sccm, no $C_2H_5F$ and reaction time 35 seconds. The time for the pump/$N_2$ purge/pump process between Step 1 and Step 2 and vice versa, was 90 seconds. FIG. 4 shows etched thickness versus ALE cycles for $C_2H_5F$. With the increase of the ALE cycles, SiN etched thickness increases linearly and no etching to p-Si, SiO, SiON and SiCN occurs. The results of the $C_2H_5F$ cyclic ALE process shows a very high selectivity of SiN to p-Si, SiO, SiON and SiCN, almost an infinite selectivity.

Comparing to the cyclic ALE process using $CH_3F$, $C_2H_5F$ gas shows higher etch selectivity of SiN to p-Si, SiO, SiON and SiCN and lower etch rate, such that less etched amount per cycle was obtained. The etched thickness of SiN per cycle using $C_2H_5F$ with various ALE cycles is listed in Table 1.

Example 3 $C_3H_7F$ Cyclic ALE Process

Figure 5:
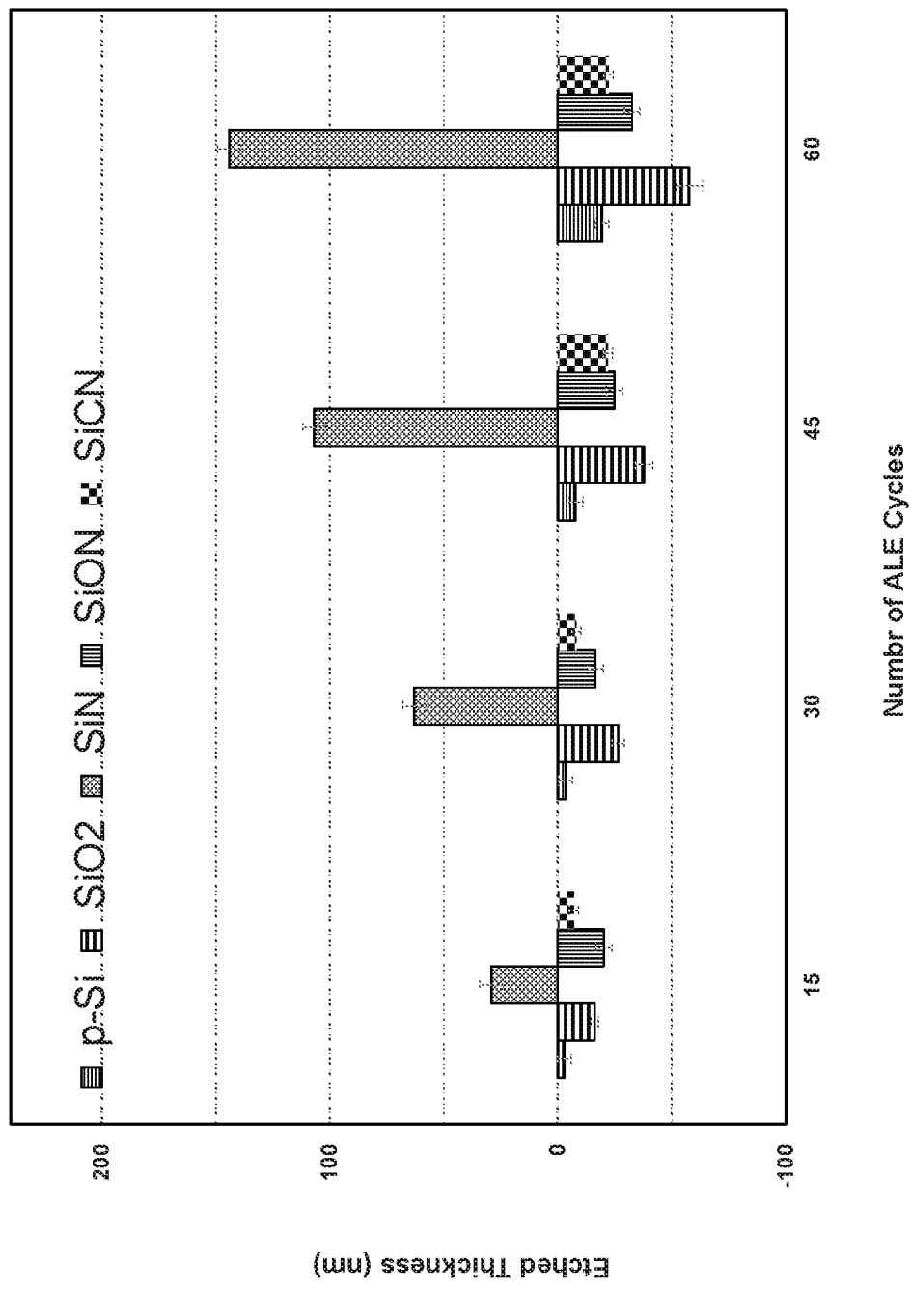
FIG. 5 is a graph of etched thickness versus ALE cycles using $C_3H_7F$.

The $C_3H_7F$ cyclic ALE process was conducted under optimized ALE conditions. Referring to FIG. 2, the etching gas was $C_3H_7F$. The deposition step (Step 1) with $C_3H_7F$ was performed with RF power 75 W, pressure 300 mTorr, Ar gas flow rate 100 sccm, $C_3H_7F$ flow rate 5 sccm and reaction time for the deposition step was 4 seconds. The removal step (Step 2) was performed with RF power 50 W, pressure 500 mTorr, Ar gas flow rate 100 sccm, no $C_3H_7F$ and reaction time 40 seconds. The time for the pump/$N_2$ purge/pump process between Step 1 and Step 2 and vice versa, was 150 seconds. FIG. 5 shows etched thickness versus ALE cycles for $C_3H_7F$. Etched thickness amount was increased linearly with number of ALE cycles, with an etch rate of 2.0-2.4 nm/cycle. An infinite etch selectivity of SiN over other material may also be obtained under optimized conditions. The etched thickness of SiN per cycle using $C_3H_7F$ with various ALE cycles is listed in Table 1.

Example 4 SEM of SiN Spacer Patterned Wafer Cyclic ALE Using $CH_3F$ and $C_2H_5F$ Referring to FIG. 1a, the dimensions of the SiN spacer patterned wafer before etch are as follows: "a" is 34 nm; "b" is 34 nm; and "c" is 34 nm. The substrate 102 is a Si substrate. Key factors concerned after etching are damage to the Si substrate, sidewall deposition, footing at the corner between the spacer and the substrate, fluoride residues on the SiN layer and the substrate or etch front, surface roughness of the SiN layer and the substrate or etch front, etc. Table 2 lists the thicknesses of the etch front after the cyclic ALE of the SiN spacer with $CH_3F$ and $C_2H_5F$ with various cyclic ALE modes, such as 50% etch, 100% etch, 100% over etch and 200% over etch. It is noticed that ALE 100% etch and ALE 100% over etch with $C_2H_5F$ provided optimized results, which demonstrate less to no footing formed at the bottom of the spacers.

TABLE 2

SEM results with $CH_3F$ and $C_2H_5F$ with various cyclic ALE modes.

| | Cyclic ALE mode | b (nm) | c (nm) |
|---|---|---|---|
| $CH_3F$ | 50% etch | 20 | 13.1 |
| | 100% etch | 0 to 5 | 0 |
| | 100% over etch | 0 | −14.1 |
| | 200% over etch | 0 | −26.7 to −27.7 |
| $C_2H_5F$ | 50% etch | 17.8 to 18.3 | 16.4 |
| | 100% etch | 0-5 | 0 |
| | 100% over etch | 0 | −3.75 to −4.22 |
| | 200% over etch | 0 | −14.1 |

Example 5 TEM of SiN Spacer Patterned Wafer Cyclic ALE Using $C_2H_5F$

ALE 100% etch and 100% over etch with $C_2H_5F$ shown in Example 4 were further tested with TEM.

Referring to FIG. 1a, the dimensions of the SiN spacer patterned wafer before etch are as follows: "a" is 34 nm; "b" is 34 nm; and "c" is 34 nm. The substrate 102 is a Si substrate. TEM-ready samples were prepared using the in situ focused ion beam (FIB) lift out technique on an FEI Strata 400 Dual Beam FIB/SEM. The samples were capped with protective carbon and e-Pt/I-Pt prior to milling. The TEM lamella thickness was ~100 nm. The samples were imaged with a FEI Tecnai Osiris FEG/TEM operated at 200 kV in bright-field (BF) TEM mode and high-resolution (HR) TEM mode. The TEM results of cyclic ALE using $C_2H_5F$ are listed in Table 3.

With ALE-100% etch, no over etch occurred, SiN on the top of the pillar was not completely etched, the left (L) and right (R) thicknesses ("$a_2$", about ⅓ of the total height of the gate stack close to the substrate) of the SiN layer on the sidewall are 32.6 and 32.3 nm, respectively, and the left and right footings ("d") were 6.6 nm and 8.2 nm. The thicknesses ("$a_2$") of the SiN layer on the sidewall reduced about 5%. In contrast, with ALE-100% over etch, SiN on the top of the pillar was completely etched, the left and right thicknesses ("$a_2$") of the SiN layer on the sidewall are 30.4 and 31.1 nm, respectively, and the left and right footings were 6.0 nm and 3.9 nm. The thicknesses ("$a_2$") of the SiN layer on the sidewall reduced about 9.5%. Thus, less than 10% of a thickness of the SiN layer on the sidewall of the gate stack is removed. The reduction of the thickness ($a_2$) of the SiN layer on the sidewall may be due to the curvature of the structure or the gate stack adjacent to the substrate that makes the inner side of the SiN layer adjacent to the structure or gate stack curved. The reduction of the thickness ($a_2$) of the SiN layer on the sidewall may also be due to small deviations.

Si recess refers to the amount of thickness of the Si substrate was etched. The Si recess was measured 10 nm away from the bottom edge of SiN sidewall toward left and right directions. With ALE-100% etch, no over etch occurred, and the left and right Si recesses were 1.446 nm and 1.285 nm, respectively. In contrast, with ALE-100% over etch, the left and right Si recesses were 4.096 nm and 4.194 nm, respectively.

Surface roughness of SiN spacer after ALE with 100% etch and 100% over etch using $C_2H_5F$ includes the surface roughness of the top of the pillar (T) and the surface roughness of the bottom of the trench (B). Table 3 also includes the surface roughness results. With ALE 100% etch, a 2-3 atomic layer level (a.l.) of SiN layer was still left on the top of the pillar (positive value), meaning the SiN layer on the top of the pillar was not completely removed. In this case, the interface between SiN layer and the top of the pillar was smooth and flat, which equivalents to the surface roughness without etching. The bottom of the trench etched with ALE-100% etch also shows 2-3 atomic layer level of SiN layer left on the bottom of the trench. With ALE-100% over etch, the top of the pillar and the bottom of the trench were all etched a 2-3 atomic layer level (negative value).

TABLE 3

TEM results with $C_2H_5F$ with different cyclic ALE modes

| | "$a_2$" (nm) | | "d" (nm) | | Si recess (nm) | | surface roughness (a.l.) | |
|---|---|---|---|---|---|---|---|---|
| ALE mode | L | R | L | R | L | R | T | B |
| 100% etch | 32.6 | 32.3 | 6.6 | 8.2 | 1.446 | 1.285 | 2 to 3 | 2 to 3 |
| 100% over etch | 30.4 | 31.1 | 6 | 3.9 | 4.096 | 4.194 | −2 to −3 | −2 to −3 |

Example 6 EDS of SiN Spacer Patterned Wafer Cyclic ALE Using $C_2H_5F$

Figure 6A:
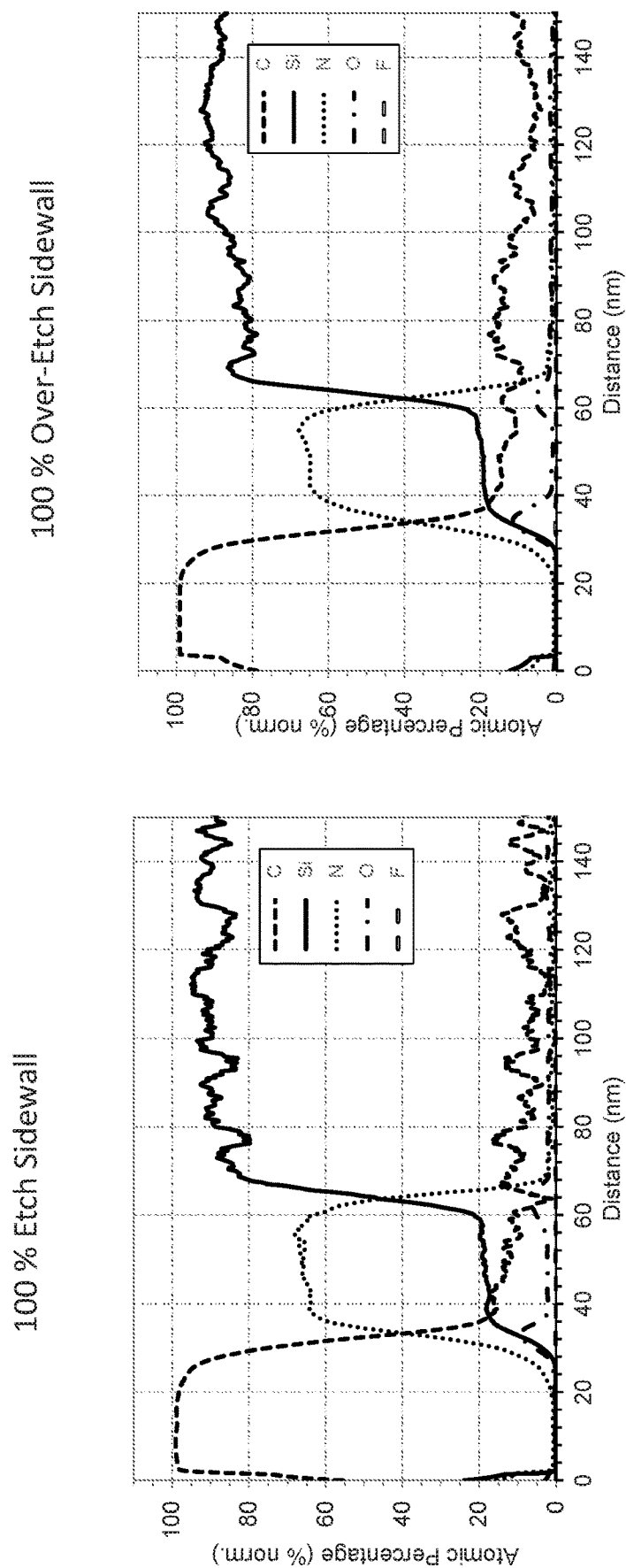
FIG. 6a is EDS mapping of SiN spacers after ALE with 100% etch sidewall and 100% over etch sidewall using $C_2H_5F$, respectively, - horizontal scan of the sidewall.

FIG. 6a shows EDS mapping of SiN spacer after ALE with 100% etch sidewall and 100% over etch sidewall using $C_2H_5F$, respectively, - horizontal scan of the sidewall. With 100% etch, no over etch occurred and no F residual on the sidewall. With 100% over etch, no F residual on the sidewall either.

Figure 6B:
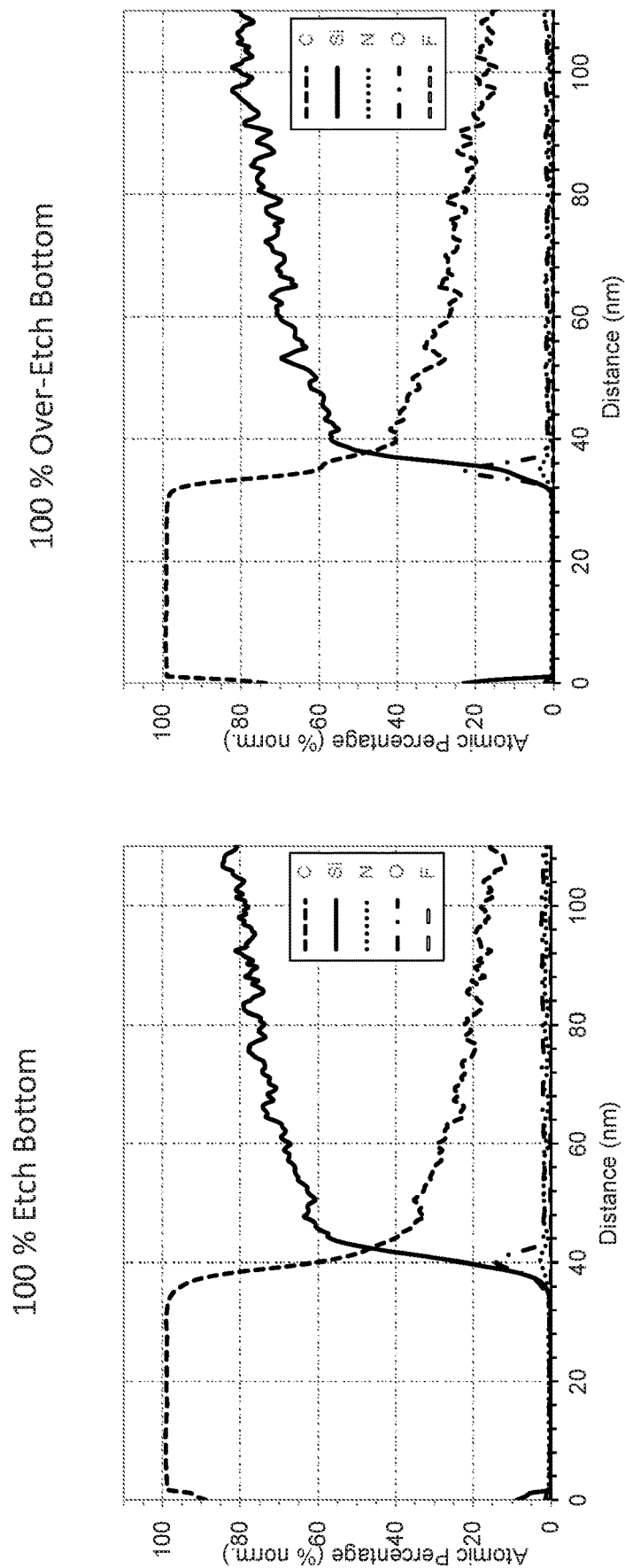
FIG. 6b shows EDS line scan using atomic of SiN spacers after ALE with 100% etch sidewall and 100% over etch sidewall using $C_2H_5F$, respectively, - vertical scan of the bottom of the spacer.

FIG. 6b shows EDS line scan using atomic of SiN spacer after the cyclic ALE with 100% etch sidewall and 100% over etch sidewall using $C_2H_5F$, respectively, - vertical scan of the bottom of the spacer. With 100% etch, no F residual on the sidewall. With 100% over etch, no F residual on the sidewall either.

Example 7 Cyclic ALE Vs Continuous Etch Using $C_2H_5F$

Table 4 is a comparison of continuous etch and cyclic ALE. The results show with continuous etch process, Si recess was 2.9 nm; polymer layer was formed on the sidewall; and the footing was 16.2 nm at the left corner and 15.3 at the right corner. Whereas, with the cyclic ALE process, the results show that Si recess was 4.1 to 4.2 nm; the minimized polymer layer was formed on the sidewall; and the footing was 6.0 nm at left and 3.9 nm was formed at right. Comparing to the continuous etch, the cyclic ALE process reduces the footing approximately 75%. Thus, with the cyclic ALE process, the Si recess and surface roughness are all getting improved and less to no footings are formed comparing to those with continuous etch process using $C_2H_5F$ to etch SiN Spacer. Here, less to no footing may be defined by "d"≤approximately 6 nm.

TABLE 4

Comparison of continuous etch and cyclic ALE

| Etch mode | Left "d" (nm) | Right "d" (nm) | Si recess (nm) | Polymer layer on sidewall |
|---|---|---|---|---|
| Continuous etch | 16.2 | 15.3 | 2.9 | yes |
| ALE 100% over etch | 6 | 3.9 | 4.1 to 4.2 | minimized |

Figure 7:
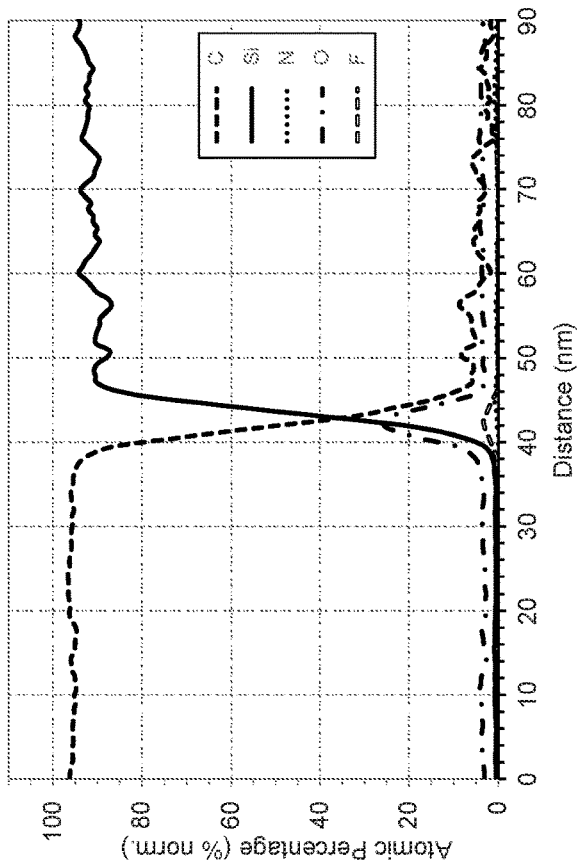
FIG. 7 is continuous etch of SiN Spacers using $C_2H_5F$: EDS mapping (left figure) and EDS line scan (right figure).
Figure 7:
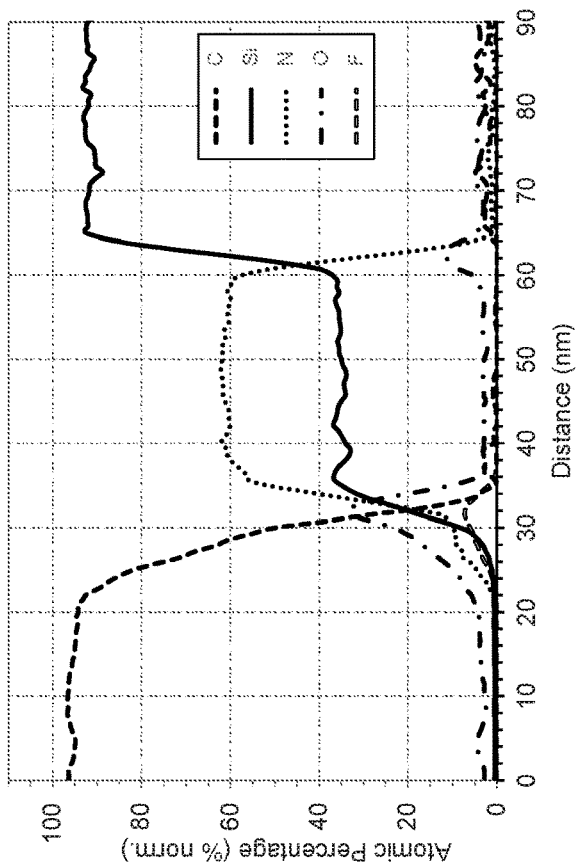

FIG. 7 shows continuous etch of SiN Spacer using $C_2H_5F$: EDS mapping (left figure) and EDS line scan (right figure). Clearly, with continuous etch, F residues existed on the sidewall (around 22 to 36 nm) and the bottom of the trench (around 36 to 58 nm). Whereas, F residues were not shown in FIG. 6a and FIG. 6b.

Table 5. lists the measured percentage of fluoride residues remained on the bottom of the trench and the sidewall after cyclic ALE and continuous etch, respectively. The cyclic ALE process modes have almost no fluoride left on the bottom of the trench and sidewall, whereas, the continuous etch method produced the fluoride residues on the bottom of the trench and sidewall.

Thus, the cyclic ALE process modes with $C_2H_5F$ produce no fluoride residues and reduced etchant residuals on the surface of etch front and sidewall. The cyclic ALE process modes with $C_2H_5F$ produce minimized SiN footings and less to no damage to the top of SiN spacer.

TABLE 5

| | Fluoride Residues | | |
|---|---|---|---|
| | ALE 100% etch | ALE 100% over etch | Continuous etch |
| Bottom of trench | 0.03% | 0.018% | 3.35% |
| Sidewall | 0.021% | 0.014% | 7.26% |

Example 8 Surface Roughness Using $C_2H_5F$ to Cyclic ALE SiN Planar Wafer

Surface roughness—RMS of a thin film of SiN on a planar wafer was measured by AFM before and after cyclic ALE with $C_2H_5F$. Before the cyclic ALE with $C_2H_5F$, RMS (Root Mean Square)=2.9 nm. After the cyclic ALE with $C_2H_5F$, RMS=1.1 nm. Thus, a smaller RMS was achieved after the cyclic ALE with $C_2H_5F$, which shows an improved surface smoothing effect of the ALE with $C_2H_5F$.

In summary, the disclosed cyclic ALE of SiN spacer using the disclosed HFCs, such as, $C_2H_5F$, $C_3H_7F$, may minimize SiN footings (e.g., reducing the footing approximately 75% comparing to the continuous etch), produce no F residues on the top of the pillar, the bottom of the trench and the sidewall, no chemical contamination and no degradation of surface roughness after cyclic ALE processes. The disclosed cyclic ALE of SiN spacer using the disclosed HFCs, such as, $C_2H_5F$, $C_3H_7F$, improves etching profile control for etching SiN spacers formed on Si-containing substrates in semiconductor applications with high selectivity.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A cyclic etch method for forming a vertically straight SiN gate spacer, the method comprising the steps of:
   i) exposing a SiN layer covering a gate stack on a silicon-containing substrate in a reaction chamber to a plasma of a hydrofluorocarbon (HFC) selected from the group consisting of $C_2H_5F$ and $C_3H_7F$ to form a polymer layer deposited on the SiN layer that modifies the surface of the SiN layer;
   ii) exposing the polymer layer deposited on the SiN layer to a plasma of an inert gas, the plasma of the inert gas removing the polymer layer deposited on the SiN layer and the modified surface of the SiN layer on an etch front; and
   iii) repeating the steps of i) and ii) until the SiN layer on the etch front is selectively removed, thereby forming a substantially vertically straight SiN spacer comprising the SiN layer on the sidewall of the gate stack.

2. The cyclic etch method of claim 1, further comprising the steps of, after the step of i),
   pumping the reaction chamber to a vacuum;
   purging the reaction chamber with $N_2$;
   pumping the reaction chamber to the vacuum; and
   introducing the inert gas into the reaction chamber to generate the plasma of the inert gas.

3. The cyclic etch method of claim 2, further comprising the steps of, after the step of ii), pumping the reaction chamber to a vacuum;
purging the reaction chamber with $N_2$;
pumping the reaction chamber to the vacuum; and
introducing $C_2H_5F$ or $C_3H_7F$ gas into the reaction chamber to generate the plasma of $C_2H_5F$ or $C_3H_7F$.

4. The cyclic etch method of claim 3, wherein in the repeating step less than 10% of the thickness ($a_2$) of the SiN layer on the sidewall of the gate stack is removed.

5. The cyclic etch method of claim 3, wherein the inert gas is Ar.

6. The cyclic etch method of claim 1, wherein $C_2H_5F$ and $C_3H_7F$ selectively etch the SiN layer over the gate stack.

7. The cyclic etch method of claim 1, wherein a footing (d) formed at each corner between the vertically straight SiN spacer and the substrate is 6.0 nm or less in size.

8. The cyclic etch method of claim 1, wherein no fluoride residuals are left on the vertically straight SiN spacer and the etch front.

9. The cyclic etch method of claim 1, wherein the step of removing the polymer layer in the step ii) is an ion bombardment process.

10. A cyclic etch method, the method comprising the steps of:
   i) exposing a SiN layer covering a structure on a substrate in a reaction chamber to a plasma of hydrofluorocarbon (HFC) to form a polymer layer deposited on the SiN layer that modifies the surface of the SiN layer, the HFC having a formula $C_xH_yF_z$ where x=2-5, y>z, the HFC being a saturated or unsaturated, linear or cyclic HFC;
   ii) exposing the polymer layer deposited on the SiN layer to a plasma of an inert gas, the plasma of the inert gas removing the polymer layer deposited on the SiN layer and the modified surface of the SiN layer on an etch front; and
   iii) repeating the steps of i) and ii) until the SiN layer on the etch front is selectively removed, thereby forming a substantially vertically straight SiN spacer comprising the SiN layer on the sidewall of the structure.

11. The cyclic etch method of claim 10, further comprising the steps of, after the step of i),
   pumping the reaction chamber to a vacuum;
   purging the reaction chamber with $N_2$;
   pumping the reaction chamber to the vacuum; and
   introducing the inert gas into the reaction chamber to generate the plasma of the inert gas.

12. The cyclic etch method of claim 11, further comprising the steps of, after the step of ii),
   pumping the reaction chamber to a vacuum;
   purging the reaction chamber with $N_2$;
   pumping the reaction chamber to the vacuum; and
   introducing the HFC into the reaction chamber to generate the plasma of the HFC.

13. The cyclic etch method of claim 10, wherein in the repeating step less than 10% of the thickness ($a_2$) of the SiN layer on the sidewall of the structure is removed.

14. The cyclic etch method of claim 10, wherein the inert gas is selected from $N_2$, Ar, Kr or Xe.

15. The cyclic etch method of claim 10, wherein the HFC is $C_2H_5F$.

16. The cyclic etch method of claim 10, wherein the HFC is $C_3H_7F$.

17. The cyclic etch method of claim 10, wherein the HFC selectively etches the SiN layer over the structure.

18. The cyclic etch method of claim 10, wherein a footing (d) formed at each corner between the vertically straight SiN spacer and the substrate is 6.0 nm or less in size.

19. The cyclic etch method of claim 10, wherein no fluoride residuals are left on the vertically straight SiN spacer and the etch front.

20. The cyclic etch method of claim 10, wherein the step of removing the polymer layer in the step ii) is an ion bombardment process.

* * * * *